United States Patent [19]
Fong

[11] Patent Number: 6,005,439
[45] Date of Patent: Dec. 21, 1999

[54] UNITY GAIN SIGNAL AMPLIFIER

[75] Inventor: Edison Fong, Sunnyvale, Calif.

[73] Assignee: National Semiconductor Corporation, Santa Clara, Calif.

[21] Appl. No.: 09/112,440

[22] Filed: Jul. 9, 1998

[51] Int. Cl.$^6$ ..................................................... H03F 3/45
[52] U.S. Cl. .......................................... 330/253; 330/257
[58] Field of Search ..................................... 330/252, 253, 330/257, 255, 301

[56] References Cited

U.S. PATENT DOCUMENTS

| | | | |
|---|---|---|---|
| 4,797,629 | 1/1989 | Widlar ..................................... | 330/258 |
| 5,530,399 | 6/1996 | Chambers et al. ...................... | 327/561 |
| 5,666,086 | 9/1997 | Klein ....................................... | 330/253 |

*Primary Examiner*—Benny Lee
*Assistant Examiner*—Henry Choe
*Attorney, Agent, or Firm*—Limbach & Limbach L.L.P.

[57] ABSTRACT

A unity gain analog signal amplifier for low voltage applications, with no DC level shifting so as to preserve dynamic range, a large bandwidth, a good driving capability for capacitive loads and a rail-to-rail output voltage range. A differential amplifier composed of matched MOSFETs is biased between current source and sink circuits. The current source is a current mirror which provides equal currents through the two branches of the differential amplifier, while the tail current is sunk by the current sink circuit. The analog input signal drives the gate terminal of one of the MOSFETs and the gate and drain terminals of the other MOSFET are connected together and provide the output signal. An additional current mirror branch driven by the current source and connected to the output terminal provides increased output current driving capacity and output voltage pull up. With two such circuits connected in a symmetrical push-pull configuration, output current sourcing and sinking as well as output voltage pull up and pull down capabilities are realized.

27 Claims, 4 Drawing Sheets

UNITY GAIN SIGNAL AMPLIFIER

BACKGROUND OF THE INVENTION

1. Field of the Invention

The present invention relates to unity gain buffer amplifiers for analog signals, and in particular, to analog signal amplifiers with true unity gain, full rail-to-rail dynamic signal range and symmetrical load current sourcing and sinking capabilities.

2. Description of the Related Art

It is well known that unity gain buffer amplifiers provide an essential building block for analog systems. Ideally, such an amplifier should have infinite frequency response, be capable of driving infinite loads while drawing only minimum power, and have no DC offset. The reality, however, is that there is always a number of compromises which must be made with respect to power dissipation, dynamic signal range, signal frequency response and transient response.

Conventional unity gain buffer amplifiers are typically variations on one of two general configurations. Referring to FIG. 1, one configuration involves an operational amplifier connected in a unity gain topology. This configuration is very common and has numerous desirable features. However, the frequency response is generally quite limited due to the high impedance nodes within the amplifier which form low frequency poles. Further, the group delay within the amplifier causes transient intermodulation distortion which makes it undesirable for high frequency applications.

Referring to FIG. 2, another common configuration involves a source follower. This configuration has good frequency response but has a gain of less than unity (typically 0.8–0.9 in metal oxide semiconductor (MOS) technology), limited dynamic signal range and unsymmetrical load current sourcing and sinking capabilities. Further, there is a voltage shift from the input (gate terminal) to the output (source terminal) of one threshold voltage drop Vt (approximately 1 volt). Such a voltage shift may be acceptable in 5-volt designs but is generally an unacceptable limitation in lower voltage designs, such as 2.5-volt designs.

Accordingly, what is needed, particularly for low-voltage designs, is a unity gain analog signal amplifier with no DC level shift (so as to preserve dynamic signal range), good frequency response, good current driving capability for capacitive loads and rail-to-rail output voltage swings.

SUMMARY OF THE INVENTION

A unity gain analog signal amplifier in accordance with the present invention provides true unity gain, a symmetrical dynamic signal range (due to no DC level shifting), good frequency response, good driving capability for capacitive loads, and rail-to-rail output voltage swings.

In accordance with one embodiment of the present invention, a unity gain analog signal amplifier includes current source circuits, a current sink circuit and a differential amplifier circuit. A first current source circuit is configured to source a first source current, while a second current source circuit is configured to source a second source current which is substantially equal in magnitude to the first source current. The current sink circuit is configured to receive and sink a sink current which is substantially equal in magnitude to a sum of the first and second source currents. The differential amplifier circuit is coupled to the first and second current source circuits and the first current sink circuit. The differential amplifier circuit includes bias terminals, differential input terminals and differential output terminals. One differential output terminal is configured to receive the first source current, the bias terminals are connected and configured to together provide the first sink current, one differential input terminal is configured to receive an input signal, and the other differential output and input terminals are connected and configured to together receive the second source current and provide an output signal which is substantially equal in magnitude to the input signal.

In accordance with another embodiment of the present invention, such a unity gain analog signal amplifier further includes additional current sink circuits, another current source circuit and another differential amplifier circuit. A second current sink circuit is configured to sink a second sink current, while a third current sink circuit is configured to sink a third sink current which is substantially equal in magnitude to the second sink current. A third current source circuit is configured to source a third source current which is substantially equal in magnitude to a sum of the second and third sink currents. The second differential amplifier circuit is coupled to the second and third current sink circuits and the third current source circuit. The second differential amplifier circuit includes bias terminals, differential input terminals and differential output terminals. One differential output terminal is configured to provide the third sink current, the bias terminals are connected and configured to together receive the third source current, one differential input terminal is configured to receive the input signal, and the other differential output and input terminals of the differential amplifier circuits are connected and configured to together receive the second source current, provide the fourth sink current and provide the output signal.

In accordance with still another embodiment of the present invention, a unity gain analog signal amplifier includes current mirror circuits, a current sink circuit, a current source circuit and differential amplifier circuits. A first current mirror circuit is configured to source first and second source currents which are substantially equal in magnitude, while a second current mirror circuit is configured to sink second and third sink currents which are substantially equal in magnitude to the first and second source currents. The current sink circuit is configured to receive and sink a first sink current which is substantially equal in magnitude to a sum of the first and second source currents, while the current source circuit is configured to source a third source current which is substantially equal in magnitude to a sum of the second and third sink currents. A first differential amplifier circuit is coupled to the first current mirror circuit and the first current sink circuit, while a second differential amplifier circuit is coupled to the second current mirror circuit and the first current source circuit. Each differential amplifier circuit includes bias terminals, differential input terminals and differential output terminals. One differential output terminal of the first differential amplifier circuit is configured to receive the first source current, while one differential output terminal of the second differential amplifier circuit is configured to provide the third sink current. The bias terminals of the first differential amplifier circuit are connected and configured to together provide the first sink current, while the bias terminals of the second differential amplifier circuit are connected and configured to together receive the third source current. One of the differential input terminals of each of the differential amplifier circuits is configured to receive an input signal, while the remaining differential output and input terminals of each of the differential amplifier circuits are all connected and configured to together receive the second source current, provide the fourth sink current and provide the output signal.

In accordance with yet another embodiment of the present invention, the first current mirror circuit is further configured to source a fourth source current, while the second current mirror circuit is further configured to sink a fourth sink current. The interconnected differential output and input terminals of each of the differential amplifier circuits are all connected and configured to together receive the second and fourth source currents, provide the third and fourth sink currents and provide the output signal.

These and other features and advantages of the present invention will be understood upon consideration of the following detailed description of the invention and the accompanying drawings.

DETAILED DESCRIPTION OF THE INVENTION

Figure 1:
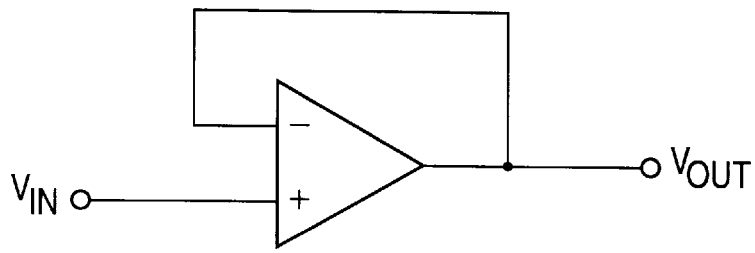
FIG. 1 is a schematic diagram of a conventional unity gain buffer amplifier using an operational amplifier.
Figure 2:
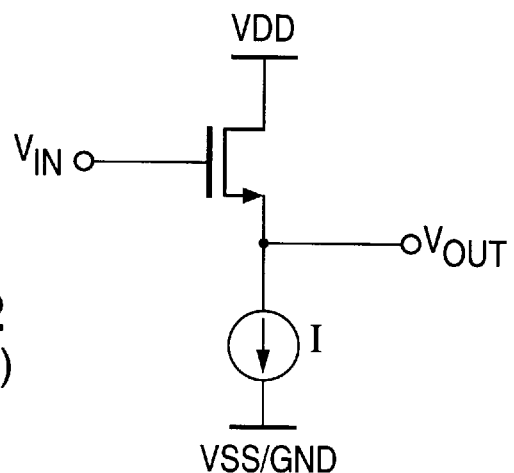
FIG. 2 is a schematic diagram of another conventional buffer amplifier design using a source follower circuit.
Figure 3:
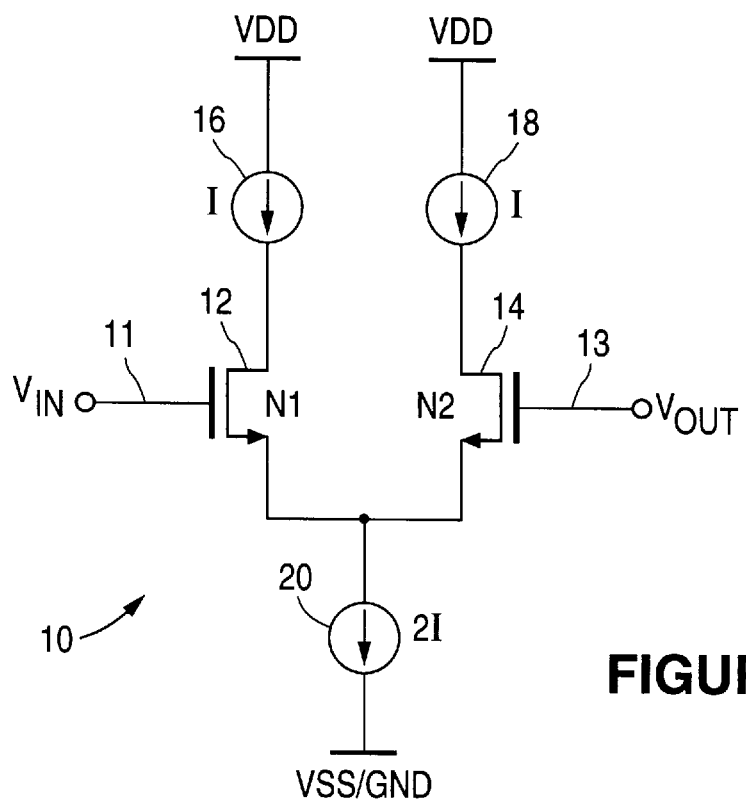
FIG. 3 is a schematic diagram of a buffer amplifier design which illustrates one of the underlying principles of the present invention.

Referring to FIG. 3, an amplifier circuit 10 which illustrates one of the underlying principals of the present invention includes a differential amplifier, composed of two N-type metal oxide semiconductor field effect transistors (N-MOSFETs) 12, 14, driven by two current sources 16, 18 which provide identical bias currents I, and a current sink circuit 20 which sinks the sum 2I of the bias currents to the negative power supply terminal VSS (or circuit ground GND). With matched transistors 12, 14 and equal load currents I (provided to the drain terminals which are often referred to as "output" terminals for MOSFETs), the gate-to-source voltages Vgs for the transistors 12, 14 are equal. Accordingly, the output voltage 13 at the gate terminal of MOSFET N2 (normally considered an "input" terminal) is equal to the input voltage VIN 11 at the gate terminal of MOSFET N1. Hence, this amplifier 10 will serve as a unity gain buffer amplifier. However, due to the output being taken from the gate terminal of a MOSFET, this circuit 10 has minimal output current driving capability.

Figure 4:
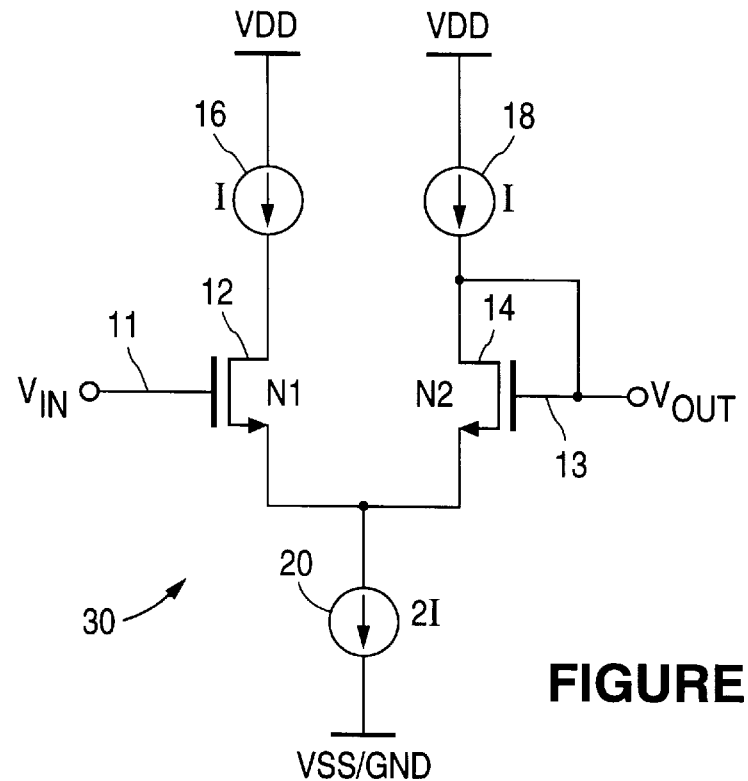
FIG. 4 is a schematic diagram of another buffer amplifier design which further illustrates one of the underlying principles of the present invention.

Referring to FIG. 4, the output current driving capability can be improved by reducing the output impedance. This can be done by connecting the gate and drain terminals together of the output transistor 14. This allows some output drive current to be provided by the current source 18 for the output device 14 and reduces the output impedance to two times the inverse of the transconductance (2/gm) of the output transistor 14. Any DC offset in the output voltage 13 will be a function of the degree to which the transistors 12, 14 are matched.

Figure 5:
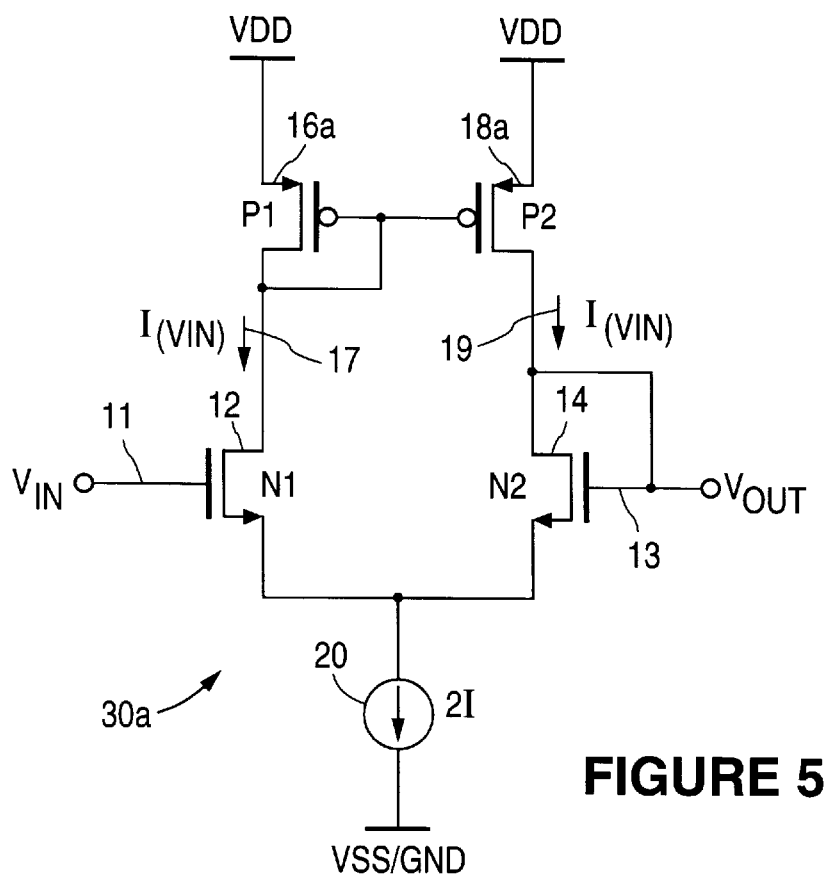
FIG. 5 is a schematic diagram of an exemplary implementation of the circuit of FIG. 4.

Referring to FIG. 5, the current sources 16 18 of the circuit 30 of FIG. 4 can be implemented together as a current mirror consisting of two P-MOSFETs 16a, 18a which provide the bias currents I(VIN) 17, 19 for the transistors 12, 14 of the differential amplifier. Again, the output impedance is 2/gm and any DC offset in the output voltage 13 will be determined by the matching of the differential amplifier transistors 12, 14 and the matching of the current mirror transistors 16a, 18a. In this implementation, due to such use of a current mirror to generate the equal source currents I(VIN) 17, 19, such currents I(VIN) 17, 19 are a function of the input voltage VIN 11, i.e., they vary in relation to the input voltage VIN 11.

Figure 6A:
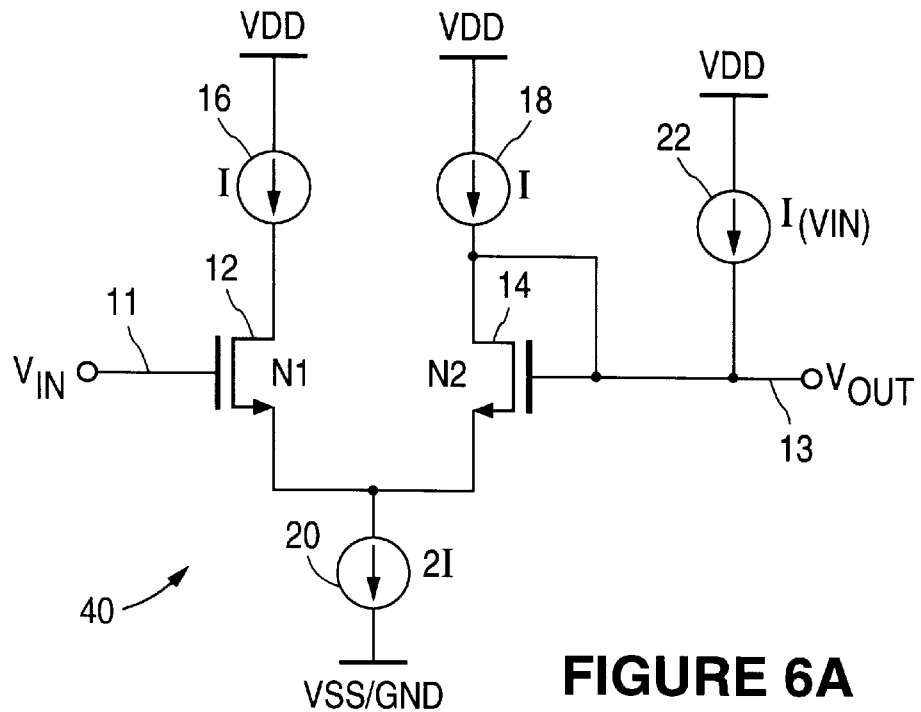
FIGS. 6A and 6B are schematic diagrams of an amplifier in accordance with one embodiment of the present invention.

Referring to FIG. 6A, output signal current drive can be increased by adding an additional current source 22 to drive the output node at the gate terminal of the output transistor 14. In this implementation, such additional current source 22 provides a current I(VIN) which is a function of the input voltage VIN 11.

Figure 6B:
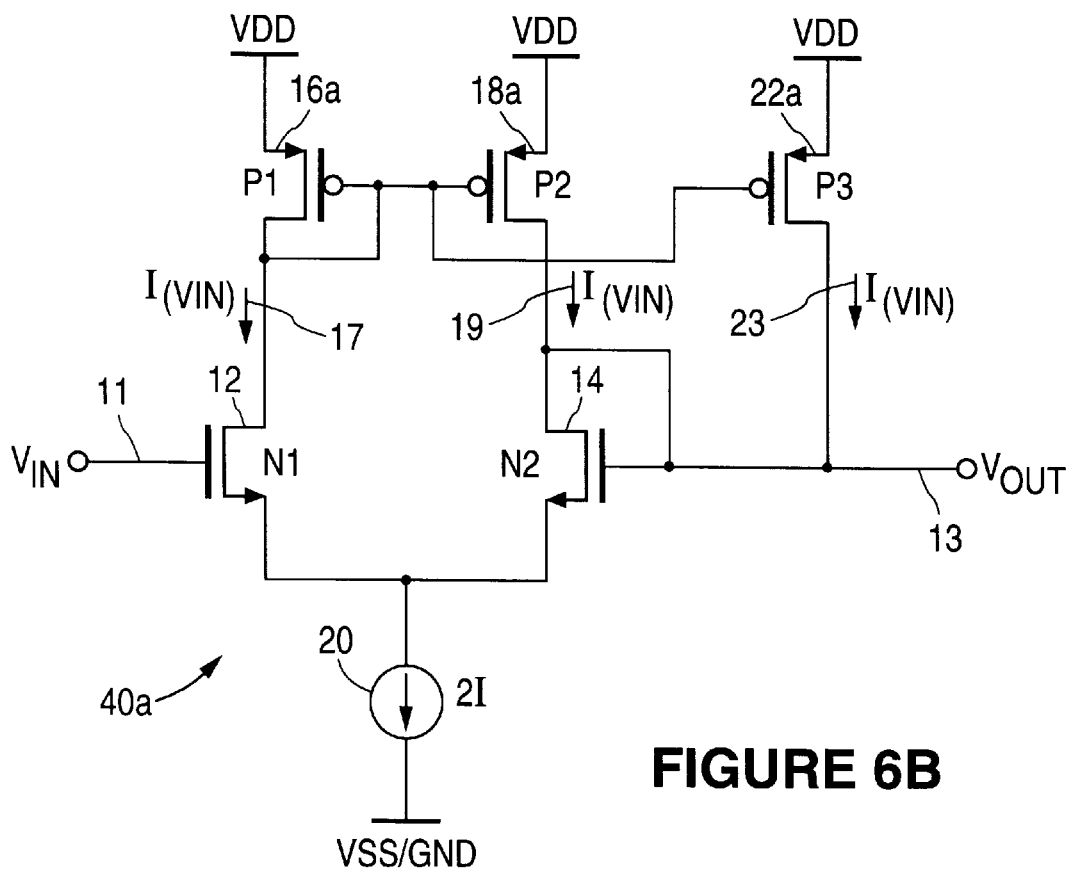

Referring to FIG. 6B, this additional output current source 22 can be implemented with a MOSFET 22a which is part of a dual current mirror circuit formed with transistors 16a and 18a. Accordingly, all three devices 16a, 18a, 22a, when matched, form a current mirror circuit which provides three related (e.g., proportional) currents I(VIN) 17, 19, 23 to the differential amplifier transistors 12, 14 and output node. Again, due to such use of a current mirror to generate the equal source currents I(VIN) 17, 19, 23, such currents I(VIN) 17, 19, 23 are a function of the input voltage VIN 11. (This additional output transistor 22a also closes a loosely coupled feedback loop via the differential amplifier transistors 12, 14 with the current mirror reference transistor 16a.) This circuit 40a provides good output voltage pull-up and output current driving capabilities, but is less capable with respect to output voltage pull-down and output current sinking capacity.

Figure 7:
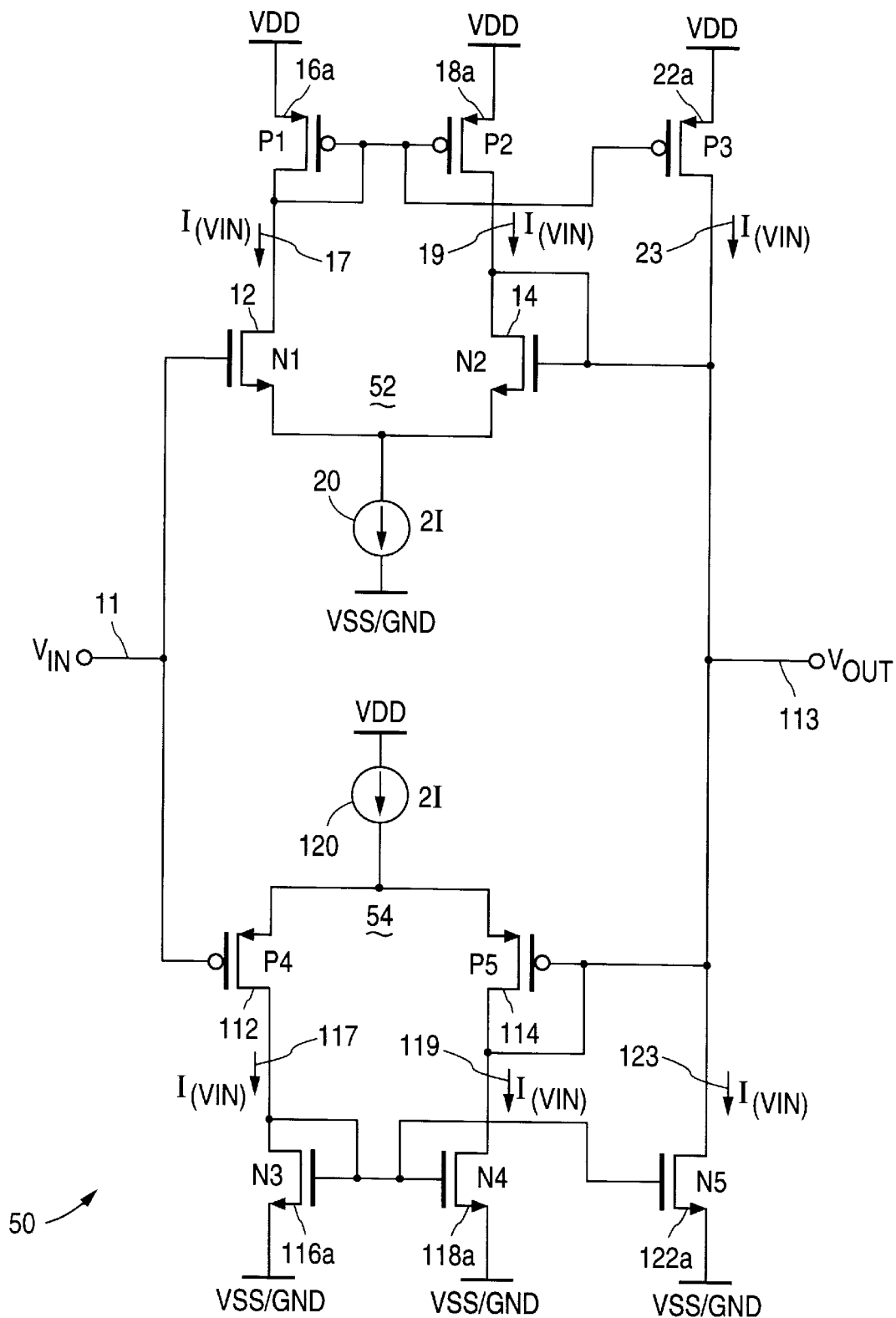
FIG. 7 is a schematic diagram of an amplifier in accordance with another embodiment of the present invention.

Referring to FIG. 7, a unity gain analog signal amplifier circuit 50 which provides true push-pull operation can be implemented substantially as shown. The upper, or "sourcing" circuit 52 is configured and operates in accordance with a foregoing discussion. The lower, or "sinking" circuit 54 provides increased voltage pull-down and output current sinking capacity for the output 113. Connected between the power supply terminals VDD, VSS/GND is an additional differential amplifier formed by two P-MOSFETs 112, 114. This differential amplifier receives its bias current 2I from a current source 120 and has its output currents I(VIN) 117, 119 sunk by a current mirror circuit formed by three N-MOSFETs 116a, 118a, 122a. Actual output current driving capacity is determined by the output pull-up 22a and pull-down 122a transistors. This circuit 50 provides true push-pull operation and is capable of driving moderate to heavy capacitive loads with rail-to-rail output signals, while accepting rail-to-rail input signals.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a unity gain analog signal amplifier, comprising:

a first current source circuit configured to source a first source current;

a second current source circuit configured to source a second source current which is substantially equal in magnitude to said first source current;

a first current sink circuit configured to receive and sink a first sink current which is substantially equal in magnitude to a sum of said first and second source currents; and a first differential amplifier circuit, coupled to said first and second current source circuits and said first current sink circuit, wherein said first differential amplifier circuit includes first and second bias terminals, first and second differential input terminals, and first and second differential output terminals, said first differential output terminal is configured to receive said first source current, said first and second bias terminals are connected and configured to together provide said first sink current, said first differential input terminal is configured to receive an input signal, and said second differential output and input terminals are connected and configured to together receive said second source current and provide an output signal which is substantially equal in magnitude to said input signal.

2. The apparatus of claim 1, wherein said first and second current source circuits together comprise a current mirror circuit.

3. The apparatus of claim 1, wherein said first differential amplifier circuit comprises a plurality of MOS transistors.

4. An apparatus including a unity gain analog signal amplifier, comprising:

a first current source circuit configured to source a first source current;

a second current source circuit configured to source a second source current which is substantially equal in magnitude to said first source current;

a first current sink circuit configured to receive and sink a first sink current which is substantially equal in magnitude to a sum of said first and second source currents;

a differential amplifier circuit, coupled to said first and second current source circuits and said first current sink circuit, wherein said differential amplifier circuit includes first and second bias terminals, first and second differential input terminals, and first and second differential output terminals, said first differential output terminal is configured to receive said first source current, said first and second bias terminals are connected and configured to together provide said first sink current, said first differential input terminal is configured to receive an input signal, and said second differential output and input terminals are connected and configured to together receive said second source current and provide an output signal which is substantially equal in magnitude to said input signal; and a third current source circuit configured to source a third source current, wherein said differential amplifier circuit is further coupled to said third current source circuit, and said second differential output and input terminals are connected and configured to together receive said second and third source currents and provide said output signal.

5. The apparatus of claim 4, wherein said third source current varies in relation to said input signal.

6. The apparatus of claim 4, wherein said first, second and third current source circuits together comprise a current mirror circuit.

7. The apparatus of claim 4, wherein said first differential amplifier circuit comprises a plurality of MOS transistors.

8. The apparatus of claim 4, wherein:

said first differential amplifier circuit comprises a first plurality of MOS transistors of a first conductivity type; and said first, second and third current source circuits comprise a second plurality of MOS transistors of a second conductivity type which is opposite to said first conductivity type.

9. An apparatus including a unity gain analog signal amplifier, comprising:

a first current source circuit configured to source a first source current;

a second current source circuit configured to source a second source current which is substantially equal in magnitude to said first source current;

a first current sink circuit configured to receive and sink a first sink current which is substantially equal in magnitude to a sum of said first and second source currents;

a first differential amplifier circuit, coupled to said first and second current source circuits and said first current sink circuit, wherein said first differential amplifier circuit includes first and second bias terminals, first and second differential input terminals, and first and second differential output terminals, said first differential output terminal is configured to receive said first source current, said first and second bias terminals are connected and configured to together provide said first sink current, said first differential input terminal is configured to receive an input signal, and said second differential output and input terminals are connected and configured to together receive said second source current and provide an output signal which is substantially equal in magnitude to said input signal;

a second current sink circuit configured to sink a second sink current;

a third current sink circuit configured to sink a third sink current which is substantially equal in magnitude to said second sink current;

a third current source circuit configured to source a third source current which is substantially equal in magnitude to a sum of said second and third sink currents; and a second differential amplifier circuit, coupled to said second and third current sink circuits and said third current source circuit, wherein said second differential amplifier circuit includes third and fourth bias terminals, third and fourth differential input terminals, and third and fourth differential output terminals, said third differential output terminal is configured to provide said third sink current, said third and fourth bias terminals are connected and configured to together receive said third source current, said third differential input terminal is configured to receive said input signal, and said second differential output and input terminals and said fourth differential output and input terminals are connected and configured to together receive said second source current, provide said fourth sink current and provide said output signal.

10. The apparatus of claim 9, wherein said second sink current is substantially equal in magnitude to said first source current.

11. The apparatus of claim 9, wherein:

said first and second current source circuits together comprise a first current mirror circuit; and said second and third current sink circuits together comprise a second current mirror circuit.

12. The apparatus of claim 9, wherein said first and second differential amplifier circuits comprise a plurality of MOS transistors.

13. The apparatus of claim 9, wherein:

said first differential amplifier circuit comprises a first plurality of MOS transistors of a first conductivity type;

said first and second current source circuits comprise a second plurality of MOS transistors of a second conductivity type which is opposite to said first conductivity type;

said second differential amplifier circuit comprises a third plurality of MOS transistors of said second conductivity type; and said second and third current sink circuits comprise a fourth plurality of MOS transistors of said first conductivity type.

14. The apparatus of claim 9, further comprising:

a fourth current source circuit configured to source a fourth source current; and a fourth current sink circuit configured to sink a fourth sink current;

wherein:

said first differential amplifier circuit is further coupled to said fourth current source circuit;

said second differential amplifier circuit is further coupled to said fourth current sink circuit; and said second differential output and input terminals and said fourth differential output and input terminals are connected and configured to together receive said second and fourth source currents, provide said third and fourth sink currents and provide said output signal.

15. The apparatus of claim 14, wherein said second sink current is substantially equal in magnitude to said first source current.

16. The apparatus of claim 14, wherein:

said fourth source current varies in relation to said input signal; and said fourth sink current varies in inverse relation to said input signal.

17. The apparatus of claim 14, wherein:

said first, second and fourth current source circuits together comprise a first current mirror circuit; and said second, third and fourth current sink circuits together comprise a second current mirror circuit.

18. The apparatus of claim 14, wherein said first and second differential amplifier circuits comprise a plurality of MOS transistors.

19. The apparatus of claim 14, wherein:

said first differential amplifier circuit comprises a first plurality of MOS transistors of a first conductivity type;

said first, second and fourth current source circuits comprise a second plurality of MOS transistors of a second conductivity type which is opposite to said first conductivity type;

said second differential amplifier circuit comprises a third plurality of MOS transistors of said second conductivity type; and said second, third and fourth current sink circuits comprise a fourth plurality of MOS transistors of said first conductivity type.

20. An apparatus including a unity gain analog signal amplifier, comprising:

a first current mirror circuit configured to source first and second source currents which are substantially equal in magnitude;

a current sink circuit configured to receive and sink a first sink current which is substantially equal in magnitude to a sum of said first and second source currents;

a second current mirror circuit configured to sink second and third sink currents which are substantially equal in magnitude to said first and second source currents;

a current source circuit configured to source a third source current which is substantially equal in magnitude to a sum of said second and third sink currents;

a first differential amplifier circuit, coupled to said first current mirror circuit and said current sink circuit; and a second differential amplifier circuit, coupled to said second current mirror circuit and said current source circuit;

wherein said first differential amplifier circuit includes first and second bias terminals, first and second differential input terminals, and first and second differential output terminals, said second differential amplifier circuit includes third and fourth bias terminals, third and fourth differential input terminals, and third and fourth differential output terminals, said first differential output terminal is configured to receive said first source current, said third differential output terminal is configured to provide said third sink current, said first and second bias terminals are connected and configured to together provide said first sink current, said third and fourth bias terminals are connected and configured to together receive said third source current, said first and third differential input terminals are configured to receive an input signal, and said second differential output and input terminals and said fourth differential output and input terminals are connected and configured to together receive said second source current, provide said fourth sink current and provide said output signal.

21. The apparatus of claim 20, wherein said first and second differential amplifier circuits comprise a plurality of MOS transistors.

22. The apparatus of claim 20, wherein:

said first differential amplifier circuit comprises a first plurality of MOS transistors of a first conductivity type;

said first current mirror circuit comprises a second plurality of MOS transistors of a second conductivity type which is opposite to said first conductivity type;

said second differential amplifier circuit comprises a third plurality of MOS transistors of said second conductivity type; and said second current mirror circuit comprises a fourth plurality of MOS transistors of said first conductivity type.

23. The apparatus of claim 20, wherein:

said first current mirror circuit is further configured to source a fourth source current;

said second current mirror circuit is further configured to sink a fourth sink current; and said second differential output and input terminals and said fourth differential output and input terminals are connected and configured to together receive said second and fourth source currents, provide said third and fourth sink currents and provide said output signal.

24. The apparatus of claim 23, wherein said fourth source current varies in relation to said input signal and said fourth sink current varies in inverse relation to said input signal.

25. The apparatus of claim 23, wherein said first and second differential amplifier circuits comprise a plurality of MOS transistors.

26. The apparatus of claim 23, wherein:

said first differential amplifier circuit comprises a first plurality of MOS transistors of a first conductivity type;

said first current mirror circuit comprises a second plurality of MOS transistors of a second conductivity type which is opposite to said first conductivity type;

said second differential amplifier circuit comprises a third plurality of MOS transistors of said second conductivity type; and said second current mirror circuit comprises a fourth plurality of MOS transistors of said first conductivity type.

27. An apparatus including a unity gain analog signal amplifier, comprising:

a first current source circuit configured to source a first source current;

a second current source circuit configured to source a second source current which is substantially equal in magnitude to said first source current;

a first current sink circuit configured to receive and sink a first sink current which is substantially equal in magnitude to a sum of said first and second source currents; and a differential amplifier circuit, coupled to said first and second current source circuits and said first current sink circuit, wherein said differential amplifier circuit includes first and second bias terminals, first and second differential input terminals, and first and second differential output terminals, said first differential output terminal is configured to receive said first source current, said first and second bias terminals are connected and configured to together provide said first sink current, said first differential input terminal is configured to receive an input signal, and said second differential output and input terminals are connected and configured to together receive said second source current and provide an output signal which is substantially equal in magnitude to said input signal;

wherein said differential amplifier circuit comprises a first plurality of MOS transistors of a first conductivity type, and said first and second current source circuits comprise a second plurality of MOS transistors of a second conductivity type which is opposite to said first conductivity type.

* * * * *